(12) United States Patent
Walker

(10) Patent No.: US 7,841,535 B2
(45) Date of Patent: Nov. 30, 2010

(54) KEYCHAIN WITH HOLDER FOR DIGITAL MEMORY CARD

(76) Inventor: Myron Walker, 94-550 Kuaie St., Mililani, HI (US) 76789

( * ) Notice: Subject to any disclaimer, the term of this patent is extended or adjusted under 35 U.S.C. 154(b) by 405 days.

(21) Appl. No.: 11/972,077

(22) Filed: Jan. 10, 2008

(65) Prior Publication Data
US 2009/0059542 A1 Mar. 5, 2009

Related U.S. Application Data

(60) Provisional application No. 60/935,799, filed on Aug. 31, 2007.

(51) Int. Cl.
*G06K 7/00* (2006.01)
(52) U.S. Cl. ...................... 235/486; 235/375
(58) Field of Classification Search .............. 235/486, 235/375, 441, 492, 451; 361/752, 748
See application file for complete search history.

(56) References Cited

U.S. PATENT DOCUMENTS

| | | |
|---|---|---|
| D329,136 S | 9/1992 | Sanchez |
| 5,467,871 A * | 11/1995 | DeField ...................... 206/232 |
| D380,293 S | 7/1997 | Cudmore |
| D461,047 S | 8/2002 | Peterson |
| 6,594,154 B1 * | 7/2003 | Brewer et al. ............... 361/801 |
| 2005/0150961 A1 | 7/2005 | Porter |
| 2008/0011628 A1 * | 1/2008 | Lin ............................ 206/307 |

* cited by examiner

*Primary Examiner*—Edwyn Labaze
(74) *Attorney, Agent, or Firm*—Welsh Flaxman & Gitler LLC

(57) ABSTRACT

A keychain includes a key ring and a housing member coupled to the key ring. The housing member includes a body member and a cover member shaped and dimensioned to slide over the body member to substantially cover the body member. The body member includes at least one pocket shaped and dimensioned for receiving a digital memory card. The body member includes a plurality of sidewalls, a front wall and an end wall. The at least one pocket is formed in one of the plurality of sidewalls and extends into a central portion of the body member. A body stop member is formed along at least one of the plurality of sidewalls, the body stop member is shaped and dimensioned for engaging a cover stop member formed along the cover member so as to provide a frictional engagement preventing inadvertent removal of the cover member when the cover member is positioned over the body member.

14 Claims, 5 Drawing Sheets

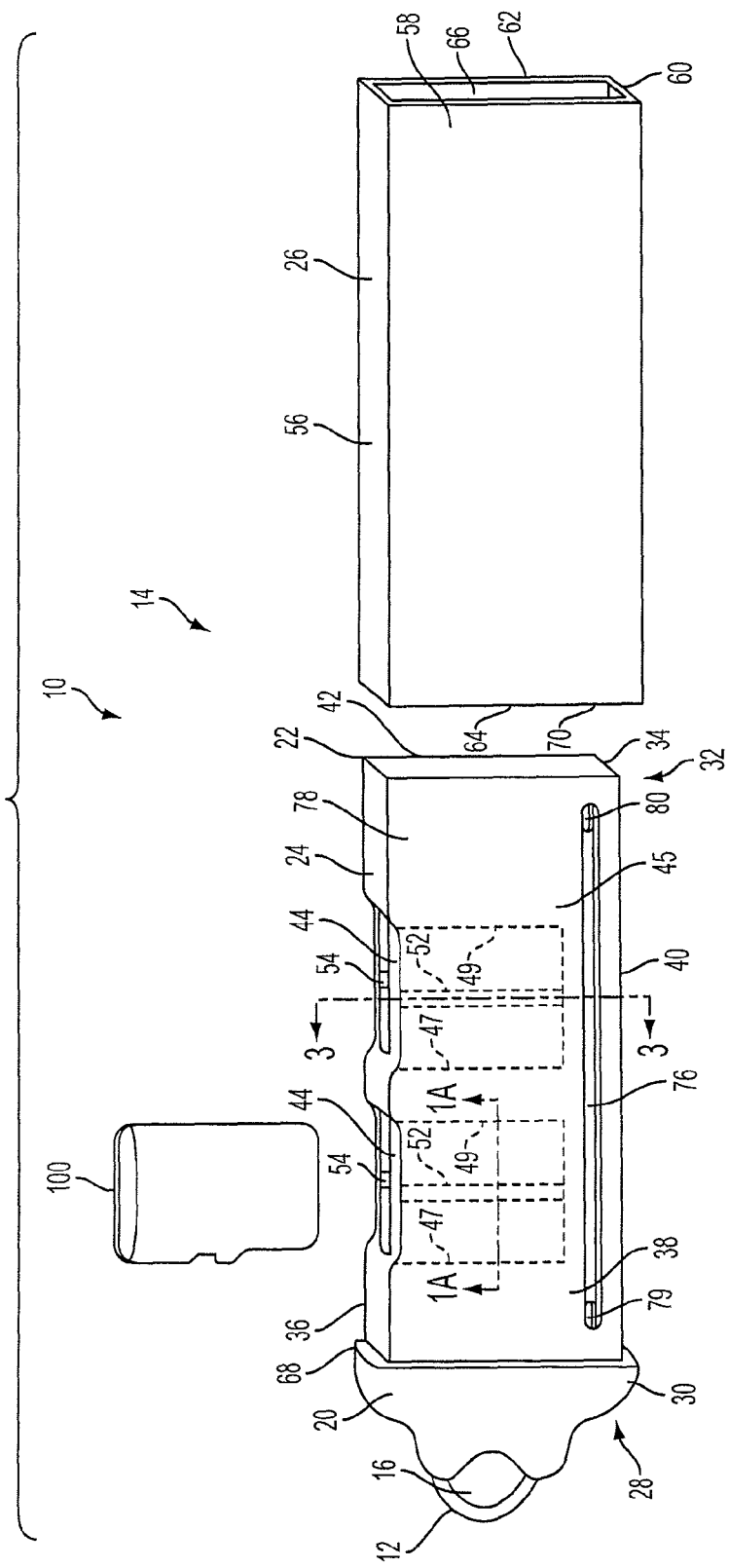
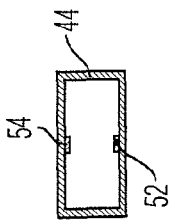
FIG. 1
FIG. 1A

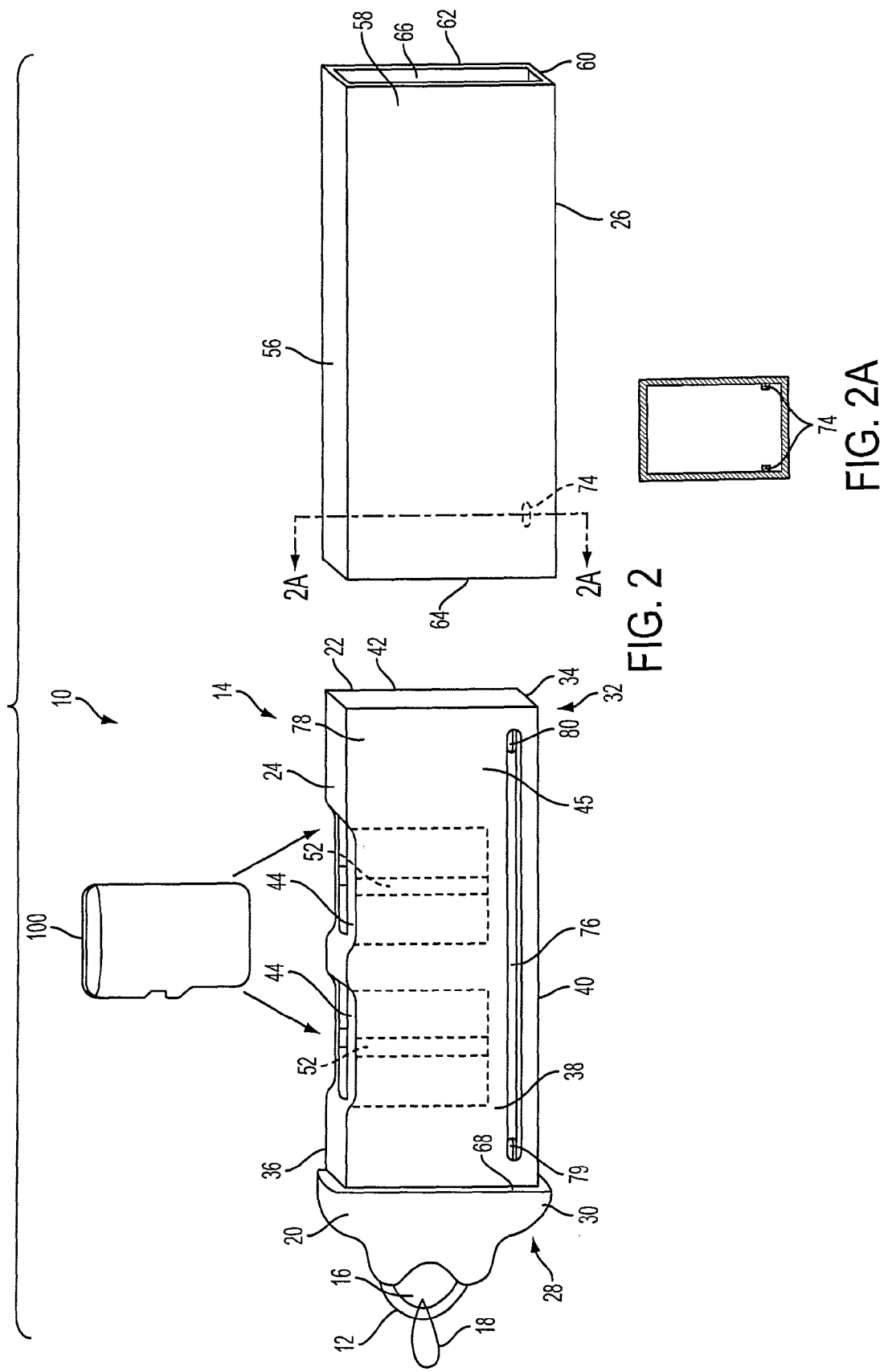

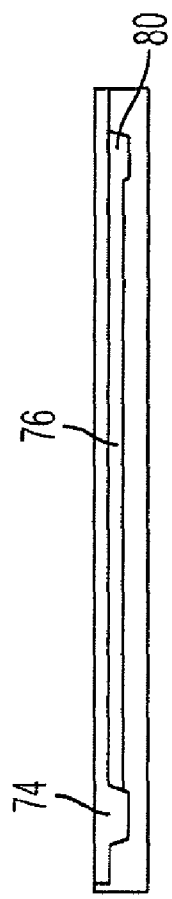
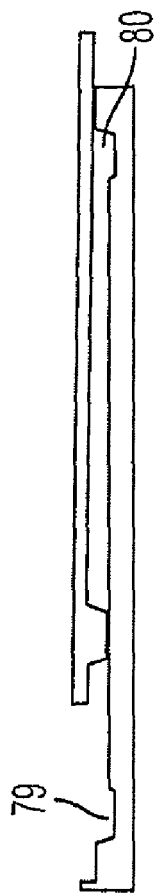
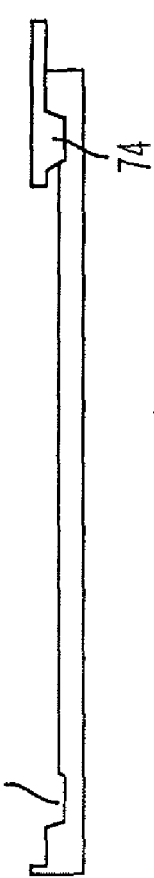
FIG. 4A
FIG. 4B
FIG. 4C
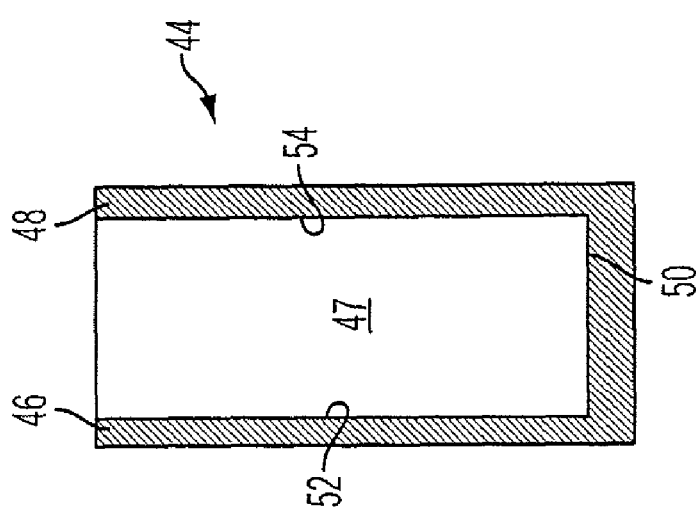
FIG. 3

KEYCHAIN WITH HOLDER FOR DIGITAL MEMORY CARD

CROSS REFERENCE TO RELATED APPLICATION

This application claims the benefit of U.S. Provisional Patent Application Ser. No. 60/935,799, filed Aug. 31, 2007, entitled "KEYCHAIN WITH HOLDER FOR DIGITAL MEMORY CARD".

BACKGROUND OF THE INVENTION

1. Field of the Invention

The invention relates a keychain including a holder for digital memory cards.

2. Description of the Related Art

Digital memory cards, or flash memory cards have become a convenient and common way for people to carry needed information from place to place. The size of these memory cards and the storage capacity allow individuals to move large amounts of data from place to place in a previously unimaginable manner.

However, the size of the memory cards often makes it difficult to securely transport them from place to place. As such, various devices have been developed to assist people in carrying memory cards from place to place. However, to date none of these prior devices have been fully effective in permitting secure and convenient carrying of a person's memory card. As such, a need continues to exist for improved carrying devices. The present invention provides such a carrying device.

SUMMARY OF THE INVENTION

It is, therefore, an object of the present invention to provide a keychain including a key ring and a housing member coupled to the key ring. The housing member includes a body member and a cover member shaped and dimensioned to slide over the body member to substantially cover the body member. The body member includes at least one pocket shaped and dimensioned for receiving a digital memory card. The body member includes a plurality of sidewalls, a front wall and an end wall. The at least one pocket is formed in one of the plurality of sidewalls and extends into a central portion of the body member. A body stop member is formed along at least one of the plurality of sidewalls, the body stop member is shaped and dimensioned for engaging a cover stop member formed along the cover member so as to provide a frictional engagement preventing inadvertent removal of the cover member when the cover member is positioned over the body member.

It is also an object of the present invention to provide a keychain wherein the key ring is half-moon shaped and includes a central recess through which a coupling member may be selectively secured.

It is another object of the present invention to provide a keychain wherein the key ring is coupled to the housing member by directly molding the housing member to the key ring.

It is a further object of the present invention to provide a keychain wherein the at least one pocket includes parallel first and second pocket sidewalls, first and second pocket edge walls and a base wall.

It is also an object of the present invention to provide a keychain wherein at least one of the first and second pocket sidewalls include an outwardly extending ridge that is shaped and dimensioned to frictionally engage the digital memory card as it is inserted within the at least one pocket.

It is still another object of the present invention to provide a keychain wherein at least one of the first and second pocket sidewalls includes an inherent resilience creating a bias toward the digital memory card as it is inserted within the at least one pocket.

It is yet another object of the present invention to provide a keychain wherein the body member includes a first pocket and a second pocket.

It is a further object of the present invention to provide a keychain wherein each of the first pocket and the second pocket includes parallel first and second pocket sidewalls, first and second pocket edge walls and a base wall.

It is also an object of the present invention to provide a keychain wherein the body stop member includes an abutment wall at a forward end of the body member, the abutment wall is shaped and dimensioned to engage a front edge of the cover member as its is slid over the body member.

It is another object of the present invention to provide a keychain wherein the cover stop member includes a stop bump formed along an inner surface of the cover member, the stop bump being shaped and dimensioned to ride within a slide slot formed along an outer surface of the body member.

It is still a further object of the present invention to provide a keychain wherein the slide slot includes a forward stop divot recessed therein and a rearward stop divot recessed therein, and when the cover member is positioned over the body member its movement relative thereto is limited to the length defined by the forward stop divot and the rearward stop divot as the stop bump of the cover member will engage and drop into these structures to stop movement as it is moved within the slide slot. Other objects and advantages of the present invention will become apparent from the following detailed description when viewed in conjunction with the accompanying drawings, which set forth certain embodiments of the invention.

BRIEF DESCRIPTION OF THE DRAWINGS

FIG. 1 is a perspective view of the device with the cover member slid off and memory card removed.

FIG. 1A is a cross sectional view along the line 1A-1A in FIG. 1.

FIG. 2 is an exploded view of FIG. 1.

FIG. 2A is a cross sectional view along the line 2A-2A in FIG. 2.

FIG. 3 is a cross sectional view along the line 3-3 of FIG. 1.

FIGS. 4A, 4B and 4C are schematics showing the slide slot and stop bump in operation.

DESCRIPTION OF THE PREFERRED EMBODIMENTS

Figure 5:
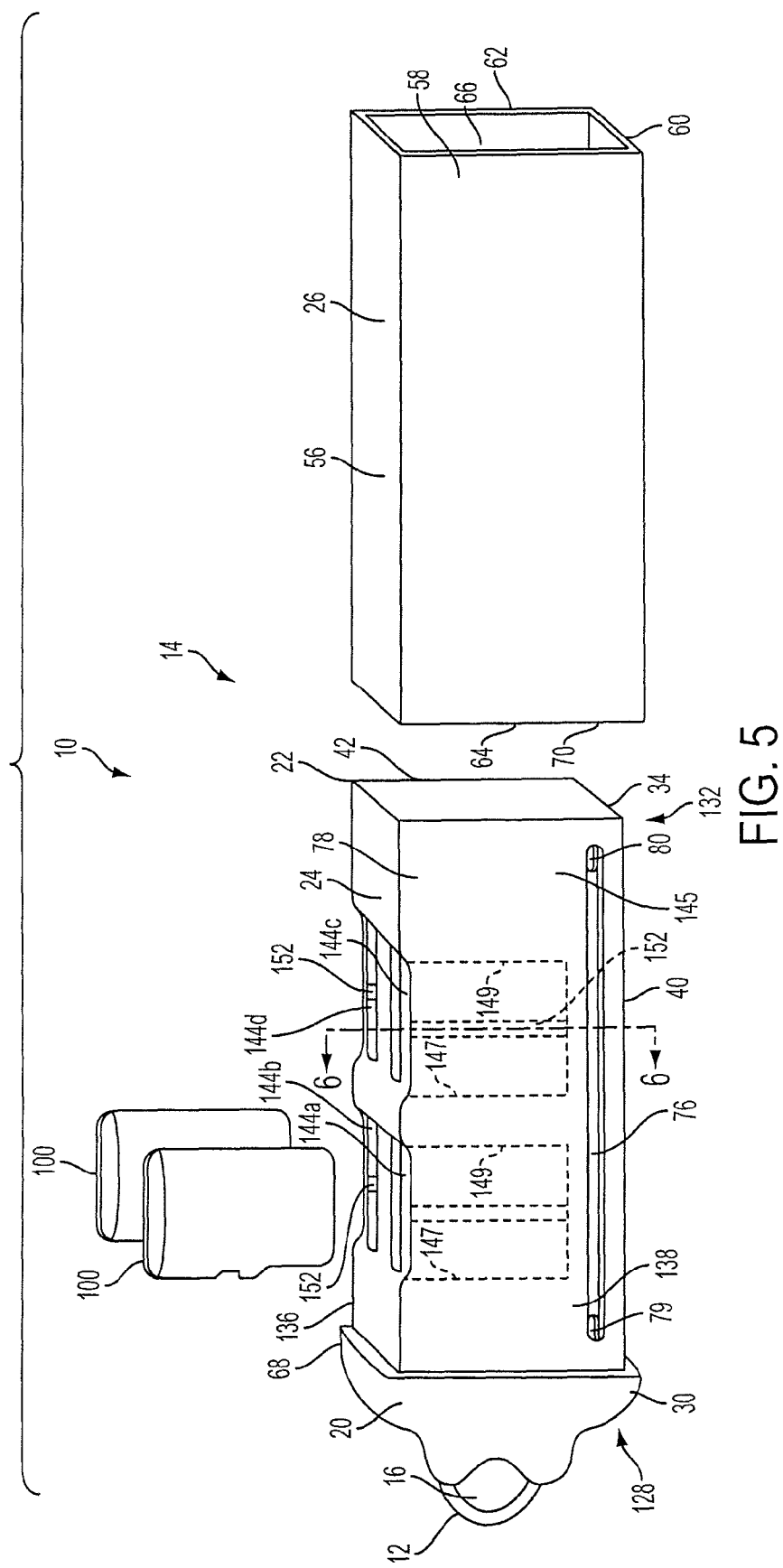
FIG. 5 is a perspective view of an alternate embodiment in accordance with the present invention.

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as a basis for teaching one skilled in the art how to make and/or use the invention.

In accordance with the present invention, and with reference to FIGS. 1, 1A, 2, 2A, 3 and 4A-C, a keychain 10 is disclosed. The present keychain 10 provides a housing for storage of multiple digital memory cards, or flash memory cards, 100 in a convenient manner providing substantial protection to the digital memory cards. As those skilled in the art will appreciate, a variety of digital memory cards are known within the art, for example, PC Card, CompactFlash, Smart-Media, Memory Stick, Multimedia Card, MMCmicro Card, Secure Digital Card, miniSD Card, microSD Card, Intelligent Stick, and Serial Flash Module, and the present invention may be readily adapted to accommodate these, as well as other memory cards, without departing from the spirit of the present invention.

In accordance with a preferred embodiment, the keychain 10 includes a key ring 12 and a housing member 14 coupled to the key ring 12. The key ring 12 may take a variety of forms and permits the selective attachment of keys or other objects thereto in a convenient and reliable manner. In accordance with a preferred embodiment, the key ring 12 is half-moon shaped with a central recess 16 through which a coupling member 18 may be selectively secured for the attachment of keys and other objects thereto. While a solid key ring is disclosed in accordance with a preferred embodiment, it is contemplated the key ring may include an integral attachment mechanism allowing for direct attachment of keys and other objects thereto.

The key ring 12 is preferably coupled to the housing member 14 by directly molding the first end 20 of the housing member 14 to the key ring 12. However, those skilled in the art will appreciate that a variety of coupling mechanisms may be employed for attaching the key ring 12 to the housing member 14 without departing from the spirit of the present invention.

With regard to the housing member 14, it generally includes a first end 20 that is coupled to the key ring 12 as discussed above and a second end 22 which is free of attachments. The housing member 14 includes a body member 24 and a cover member 26 shaped and dimensioned to slide over the body member 24 to substantially cover the body member 24 and the memory cards stored therein.

The body member 24 includes forward end 28 including a front wall 30, rearward end 32 including a end wall 34, and a plurality of sidewalls 36, 38, 40, 42 extending between the front wall 30 and the end wall 34. In accordance with a preferred embodiment of the present invention, the body member 24 includes a substantially rectangular cross sectional shape when viewed perpendicular to the longitudinal axis of the body member 24. As such, the body member 24 includes first, second, third and fourth sidewalls 36, 38, 40, 42, wherein the first and third sidewalls 36, 40 are short sidewalls and the second and fourth sidewalls 38, 42 are long sidewalls. While a rectangular configuration is disclosed in accordance with a preferred embodiment, it is contemplated the body member could be formed with a variety of cross-sectional configurations without departing from the spirit of the present invention.

The body member 24 is further provided with at least one pocket 44 shaped and dimensioned for receiving a digital memory card 100. The at least one pocket 44 is formed in one of the plurality of sidewalls, in accordance with a preferred embodiment, the pocket 44 is formed in first sidewall 36, and extends into a central portion 45 of the body member 24. In accordance with the embodiment shown with reference to FIGS. 1, 1A, 2, 2A, 3 and 4A-C, the body member 24 is provided with first and second pockets 44. However, it is contemplated one, or more, pockets may be provided without departing from the spirit of the present invention.

Referring to FIGS. 1, 1A, 2, 2A and 3, each of the pockets 44 includes parallel first and second pocket sidewalls 46, 48, first and second pocket edge walls 47, 49 and a base wall 50. The first and second pocket sidewalls 46, 48 respectively include an outwardly extending ridge 52, 54 that is shaped and dimensioned to frictionally engage a digital memory card 100 as it is inserted within the pocket 44. In addition, each of the first and second pocket sidewalls 46, 48 includes an inherent resilience creating a bias toward the digital memory card 100 as it is inserted within the pocket 44, engages the respective ridges 52, 54 of the first and second pocket sidewalls 46, 48 and slightly pushes the first and second pocket sidewalls 46, 48 outwardly.

With regard to the cover member 26, it is a substantially tubular member shaped and dimensioned to fit snuggly over the body member 24. As such, the cover member 26 includes first, second, third and fourth sidewalls 56, 58, 60, 62, as well as a front aperture 64 and a rear aperture 66. Since the cover member 26 is shaped and dimensioned to fit snuggly over the body member 24, the first, second, third and fourth sidewalls 56, 58, 60, 62 of the cover member 26 are slightly wider than the respective first, second, third and fourth sidewall 36, 38, 40, 42 of the body member 24.

Controlled positioning of the cover member 26 as it is slid over the body member 24 is achieved by the provision of various body stop members and cover stop members that interact to control positioning of the cover member 26 upon the body member 24. In particular, the body member 24 is provided with an abutment wall 68 at the forward end 28 of the body member 24. The abutment wall 68 is shaped and dimensioned to engage the front edge 70 of the respective first, second, third and fourth sidewalls 56, 58, 60, 62 as the cover member 26 is slid over the body member 24.

Controlled positioning is further achieved by providing the inner surface 72 of the cover member 26 with a stop bump 74 shaped and dimensioned to ride within a slide slot 76 formed along the outer surface 78 of body member 24. Although only one slide slot 76 and stop bump 74 are discussed, it is contemplated that the device could include a slide slot 76 on opposite sidewalls. More particularly, the second and fourth sidewalls 38, 42 of the body member 24 each includes a slide slot 76 that extends between the forward end 28 and the rearward end 32 of the body member 24. As best seen in FIG. 4, the slide slot 76 includes a forward stop divot 79 recessed therein and a rearward stop divot 80 recessed therein. As a result, when the cover member 26 is positioned over the body member 24, its movement relative thereto is limited to the length defined by the forward stop divot 79 and the rearward stop divot 80 as the stop bump 74 of the cover member 26 will engage and drop into these structures to stop movement as it is moved within the slide slot 76. When the stop bump 74 is not located in either of the divots resistance is created between the slide slot 76 and stop bump 74 by the pressure created there between. Thus, the cover member 26 is not free to slide open and close and requires a slight force to move the stop bump 74, and in turn the cover member 26, along the length of body member 24.

Figure 6:
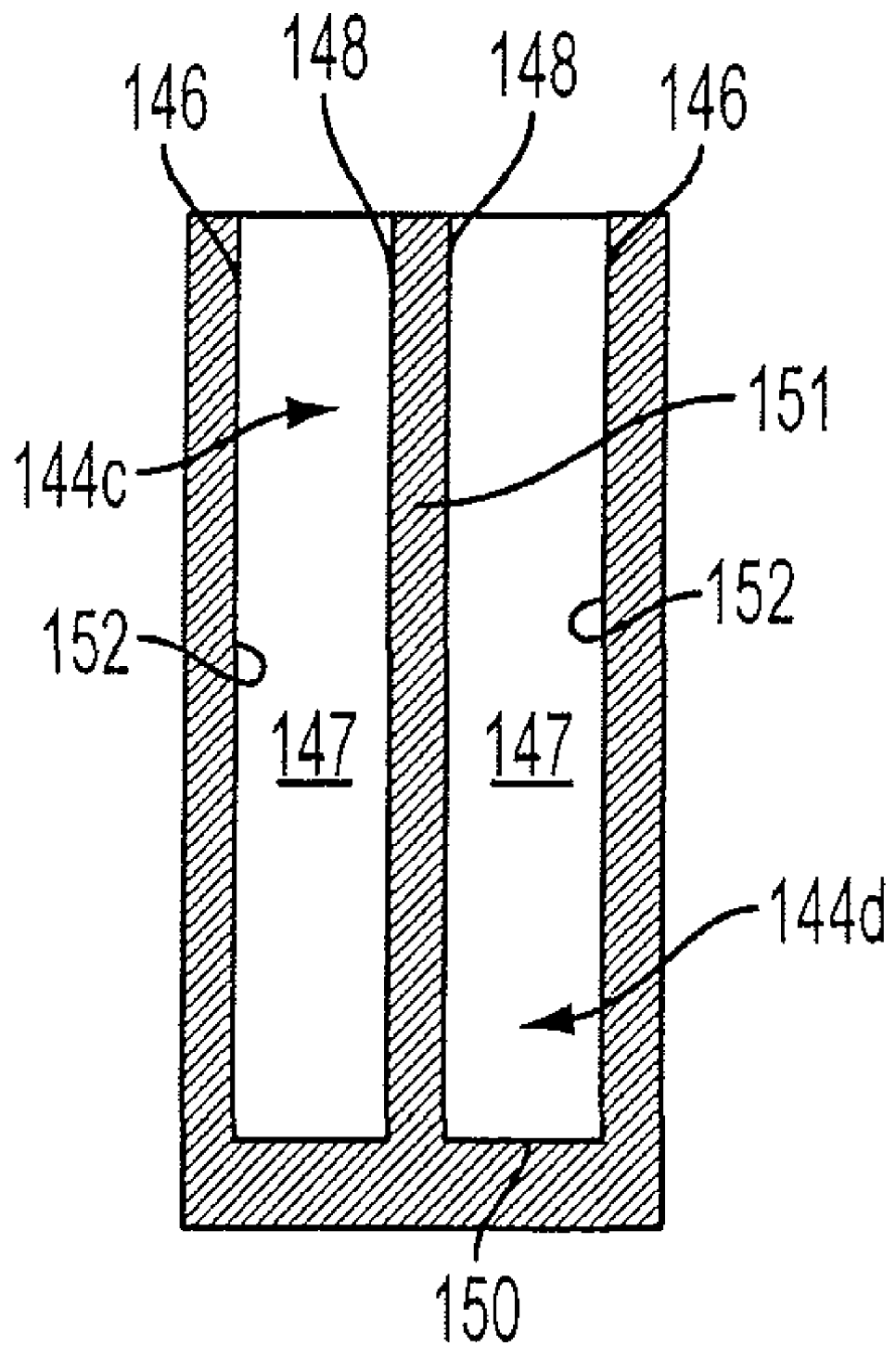
FIG. 6 is a cross sectional view along the line 6-6 in FIG. 5.

With reference to FIGS. 5 and 6, an alternate embodiment of the present invention is disclosed. This alternate embodiment shows a keychain 10 including first, second, third and fourth pockets 144a, 144b, 144c, 144d as opposed to the first and second pockets shown with reference to FIG. 1-4.

In accordance with this embodiment, the first, second, third and fourth pockets 144a, 144b, 144c, 144d are formed along the first sidewall 136 of the body member 124. As with the prior embodiment, the pockets 144a, 144b, 144c, 144d extend into a central portion 145 of the body member 124.

In accordance with this embodiment, the first and second pockets 144a, 144b are positioned adjacent a forward end 128 of the body member 124 while the third and fourth pockets 144c, 144d are positioned adjacent a rearward end 132 of the body member 124. The first and second pockets 144a, 144b, as well as the third and fourth pockets 144c, 144d are positioned in back to back relationship between the second and fourth sidewalls 138, 142. With this in mind, each of the first, second, third and fourth pockets 144a, 144b, 144c, 144d include parallel first and second pocket sidewalls 146, 148, first and second pocket edge walls 147, 149, and a base wall 150. However, and in contrast to the claimed invention, the second pocket sidewall 148 of one pocket and the second pocket side wall 148 of another pocket are constructed along opposite sides of a central wall 151 separating the first pocket 144a from the second pocket 144b and separating the third pocket 144c from the fourth pocket 144d.

Where such an embodiment is employed, it is not desirable to place extending ridges along the second pocket sidewall 148 in view of the shared central wall 151. As such, and in accordance with the present embodiment, extending ridges 152 are positioned along the first pocket sidewall 146 of each pocket 144a, 144b, 144c, 144d and the second pocket sidewalls 148, which are opposed to each other along the central wall 151, carry no extending ridge. As with the prior embodiment, the first pocket sidewalls 146 include an inherent resilience creating a bias toward the digital memory card 100 as it is inserted within the respective pockets 144a, 144b, 144c, 144d, engages the ridge 152 and the first and second pocket sidewalls and slightly pushes the first pocket sidewall 146 outwardly.

While the preferred embodiments have been shown and described, it will be understood that there is no intent to limit the invention by such disclosure, but rather, is intended to cover all modifications and alternate constructions falling within the spirit and scope of the invention.

The invention claimed is:

1. A keychain, comprising:
   a key ring;
   a housing member coupled to the key ring, the housing member including:
   a body member and a slidable cover member shaped and dimensioned to slide over the body member to substantially cover the body member and slide over the body member to expose the body member;
   the body member includes at least one pocket shaped and dimensioned for receiving a digital memory card, wherein the body member includes a plurality of sidewalls, a front wall and an end wall, and the at least one pocket is formed in one of the plurality of sidewalls and extends into a central portion of the body member;
   a body stop member formed along at least one of the plurality of sidewalls, the body stop member being shaped and dimensioned for engaging a cover stop member formed along the slidable cover member so as to provide a frictional engagement preventing inadvertent removal of the slidable cover member when the cover member is slid along the body member and over the pocket formed in the body member.

2. The keychain according to claim 1, wherein the key ring is half-moon shaped and includes a central recess through which a coupling member may be selectively secured.

3. The keychain according to claim 2, wherein the key ring is preferably coupled to the housing member by directly molding the housing member to the key ring.

4. The keychain according to claim 1, wherein the at least one pocket includes parallel first and second pocket sidewalls, first and second pocket edge walls and a base wall.

5. The keychain according to claim 4, wherein at least one of the first and second pocket sidewalls include an outwardly extending ridge that is shaped and dimensioned to frictionally engage the digital memory card as it is inserted within the at least one pocket.

6. The keychain according to claim 5, wherein at least one of the first and second pocket sidewalls includes an inherent resilience creating a bias toward the digital memory card as it is inserted within the at least one pocket.

7. The keychain according to claim 1, wherein the body member includes a first pocket and a second pocket.

8. The keychain according to claim 7, wherein each of the first pocket and the second pocket includes parallel first and second pocket sidewalls, first and second pocket edge walls and a base wall.

9. The keychain according to claim 8, wherein at least one of the first and second pocket sidewalls include an outwardly extending ridge that is shaped and dimensioned to frictionally engage the digital memory card as it is inserted within either of the first pocket or the second pocket.

10. The keychain according to claim 9, wherein at least one of the first and second pocket sidewalls includes an inherent resilience creating a bias toward the digital memory card as it is inserted within either of the first pocket or the second pocket.

11. The keychain according to claim 1, wherein the body stop member includes an abutment wall at a forward end of the body member, the abutment wall is shaped and dimensioned to engage a front edge of the cover member as its is slid over the body member.

12. The keychain according to claim 1, wherein the cover stop member includes a stop bump formed along an inner surface of the cover member, the stop bump being shaped and dimensioned to ride within a slide slot formed along an outer surface of the body member.

13. The keychain according to claim 12, wherein the slide slot includes a forward stop divot recessed therein and a rearward stop divot recessed therein, and when the cover member is positioned over the body member its movement relative thereto is limited to the length defined by the forward stop divot and the rearward stop divot as the stop bump of the cover member will engage and drop into these structures to stop movement as it is moved within the slide slot.

14. A keychain, comprising:
   a key ring;
   a housing member coupled to the key ring, the housing member including:
   a body member and a slidable cover member shaped and dimensioned to slide over the body member to substantially cover the body member and slide over the body member to expose the body member;
   the body member includes at least one pocket shaped and dimensioned for receiving a digital memory card, wherein the body member includes a plurality of sidewalls, a front wall and an end wall, and the at least one pocket is formed in one of the plurality of sidewalls and extends into a central portion of the body member;
   a body stop member formed along at least one of the plurality of sidewalls to prevent inadvertent removal of the slidable cover member when the cover member is slid along the body member and over the pocket formed in the body member.

* * * * *